(12) United States Patent
Ackland et al.

(10) Patent No.: US 8,063,422 B2
(45) Date of Patent: Nov. 22, 2011

(54) IMAGE DETECTION APPARATUS AND METHODS

(75) Inventors: Bryan D. Ackland, Old Bridge, NJ (US); Conor S. Rafferty, Newton, MA (US); Paul W. Latham, II, Lee, NH (US)

(73) Assignee: Infrared Newco, Inc., Tucson, AZ (US)

( * ) Notice: Subject to any disclaimer, the term of this patent is extended or adjusted under 35 U.S.C. 154(b) by 730 days.

(21) Appl. No.: 12/109,846

(22) Filed: Apr. 25, 2008

(65) Prior Publication Data

US 2009/0267120 A1 Oct. 29, 2009

(51) Int. Cl.
*H01L 31/062* (2006.01)
(52) U.S. Cl. .............. 257/291; 257/E27.133; 250/208.1
(58) Field of Classification Search .................. 257/291, 257/E27.133; 250/208.1
See application file for complete search history.

(56) References Cited

U.S. PATENT DOCUMENTS

| | | | |
|---|---|---|---|
| 6,127,857 A * | 10/2000 | Ogawa et al. | 327/94 |
| 6,201,572 B1 * | 3/2001 | Chou | 348/241 |
| 6,791,610 B1 | 9/2004 | Butler et al. | |
| 2002/0175269 A1 * | 11/2002 | Krymski | 250/208.1 |
| 2004/0036009 A1 * | 2/2004 | Takayanagi et al. | 250/208.1 |
| 2006/0071277 A1 * | 4/2006 | Peterson | 257/357 |
| 2009/0108176 A1 * | 4/2009 | Blanquart | 250/208.1 |

OTHER PUBLICATIONS

D'Amico et al. "A 4.1-mW 10-MHz Fourth Order Source Folloer Based Continuous-Time Filter with 79 dB DR," IEEE Journ.of Solid State Circuits vol. 41 No. 12, 2713, 2006.*
Bausells et al., "Ion-Sensitive Field-Effect Transistors Fabricated in a Commercial CMOS Technology," *Elsevier Science S.A. Sensors and Actuators*, pp. 56-62 (1999).
Holst et al., "CMOS/CCD Sensors and Camera Systems," *JCD Publishing*, pp. 86-109.
Milgrew et al., "The Development of Scalable Sensor Arrays Using Standard CMOS Technology," *Elsevier Science S.A. Sensors and Actuators*, pp. 37-42 (2004).
Milgrew et al., "A Large Transistor-Based Sensor Array Chip for Direct Extracellular Imaging," *Elsevier Science S.A. Sensors and Actuators*, pp. 347-353 (2005).

* cited by examiner

*Primary Examiner* — Tom Thomas
*Assistant Examiner* — Matthew Reames
(74) *Attorney, Agent, or Firm* — Wolf, Greenfield & Sacks, P.C.

(57) ABSTRACT

MOS imaging pixels are described. The MOS imaging pixels may comprise bootstrapped source followers, having their bodies connected to their sources. The source followers of the MOS imaging pixels may be used to buffer a signal indicative of an amount of radiation incident on the pixel. MOS imagers are also described, which may comprise one or more MOS imaging pixels of the type described.

12 Claims, 9 Drawing Sheets

US 8,063,422 B2

IMAGE DETECTION APPARATUS AND METHODS

BACKGROUND

1. Field

The technology described herein relates to image detection apparatus and methods, such as metal oxide semiconductor (MOS) imagers and pixels.

2. Related Art

Conventional MOS imagers are known, and have a structure like that shown in FIG. 1. The imager 100 includes a focal plane array 101 formed by multiple pixels 102 arranged in rows and columns. The focal plane array 101 includes N rows and M columns of pixels 102. Each pixel 102 includes a photodetector which detects incident radiation in the visible spectrum and produces an output signal representative of the amount of incident radiation. The output signals of the pixels are provided to an image signal processor 104, which processes them to produce an image. The output signals of pixels 102 are provided serially to the image signal processor 104 under control of row multiplexer circuitry 106 and column multiplexer circuitry 108.

In a MOS imager, the pixels 102 are implemented using MOS technology. FIG. 2 illustrates a circuit schematic of one such pixel. The pixel 102 includes a photodetector 202, and additional circuitry to condition and control readout of the photodetector output to column line 204 as the output of pixel 102. The photodetector 202 is a photodiode, and is operated in a reverse-biased mode, having one terminal grounded and the other terminal connected to a positive rail $V_{dd}$ by a precharge transistor 206. The precharge transistor 206 is an n-channel MOS field effect transistor (MOSFET), having its body grounded. The drain of precharge transistor 206 is connected to the positive rail $V_{dd}$ and the source is connected to the photodetector 202.

As mentioned, the output of the pixel 102 is provided to the column line 204. Pixel 102 is one of multiple pixels in the focal plane array 101, with each pixel 102 in a column sharing a single column line 204 for providing their output signals. The output signal of photodetector 202 is not provided directly to column line 204, but rather it is buffered by a source follower 208, which is an n-channel MOSFET having its body grounded, and its gate connected to the photodetector 202.

The pixels of the focal plane array are read out by row, with each pixel providing its output to its respective column line. A row select signal is applied to all the pixels of the row when the output signals of the pixels of that row are to be read out. A row select transistor 210 in the pixel 102 is turned on by the row select signal, connecting source follower 208 to column line 204. A load (not shown) on the column line 204 causes the source follower 208 to operate as a source follower, with the voltage at its source roughly tracking the voltage at its gate.

SUMMARY

According to one aspect of the invention, an apparatus comprising a MOS imaging pixel is provided. The MOS imaging pixel comprises a photodetector circuit configured to receive incident radiation and produce at an output a voltage signal indicative of an amount of the incident radiation. The MOS imaging pixel further comprises a MOS field effect transistor (MOSFET) configured as a source follower, the MOSFET having a body, a source, and a gate, the source being connected to the body, and the gate being configured to receive the voltage signal indicative of the amount of the incident radiation.

According to another aspect of the invention, an apparatus comprising a MOS imaging pixel is provided. The MOS imaging pixel comprises a photodetector configured to receive incident radiation and generate a photocurrent in response thereto indicative of an amount of the incident radiation. The MOS imaging pixel further comprises an integration node at which the photocurrent is integrated to create a voltage signal indicative of the amount of the incident radiation. The MOS imaging pixel further comprises a MOS field effect transistor (MOSFET) configured as a source follower, the MOSFET having a body, a source, and a gate, wherein the body is connected to the source and wherein the gate is connected to the integration node to receive the voltage signal indicative of the amount of the incident radiation. The MOS imaging pixel further comprises a substrate having a first conductivity type (n or p), the body of the MOSFET comprising a well of a second conductivity type (n or p) opposite the first conductivity type formed in the substrate.

According to another aspect, an apparatus is provided. The apparatus comprises a substrate having a first conductivity type (n or p), and a plurality of imaging pixels formed on the substrate and configured in a focal plane array. The plurality of pixels comprises a first pixel comprising a photodetector configured to receive incident radiation and generate a photocurrent in response thereto indicative of an amount of the incident radiation. The first pixel further comprises a MOS field effect transistor (MOSFET) configured as a source follower, the MOSFET having a body, a source, and a gate, the source being connected to the body, the gate being configured to receive a signal indicative of the amount of the incident radiation, the signal being at least partially dependent on the photocurrent. Each pixel of the plurality of pixels comprises a well having a second conductivity type (n or p) opposite the first conductivity type, and wherein a well of the first pixel corresponds to the body of the MOSFET.

According to another aspect, an apparatus is provided comprising a MOS imaging pixel. The MOS imaging pixel comprises a photodetector circuit configured to receive incident radiation and produce at an output a voltage signal indicative of an amount of the incident radiation. The MOS imaging pixel further comprises a buffer having an input terminal coupled to the output of the photodetector circuit to receive the voltage signal indicative of the amount of the incident radiation. The buffer has an output terminal that provides a buffered signal indicative of the amount of the incident radiation. The buffer comprises a source follower formed by a MOS field effect transistor (MOSFET) and a load, the MOSFET having a body, a source, and a gate, wherein the body is connected to the source. The gain of the buffer is at least approximately 0.9.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
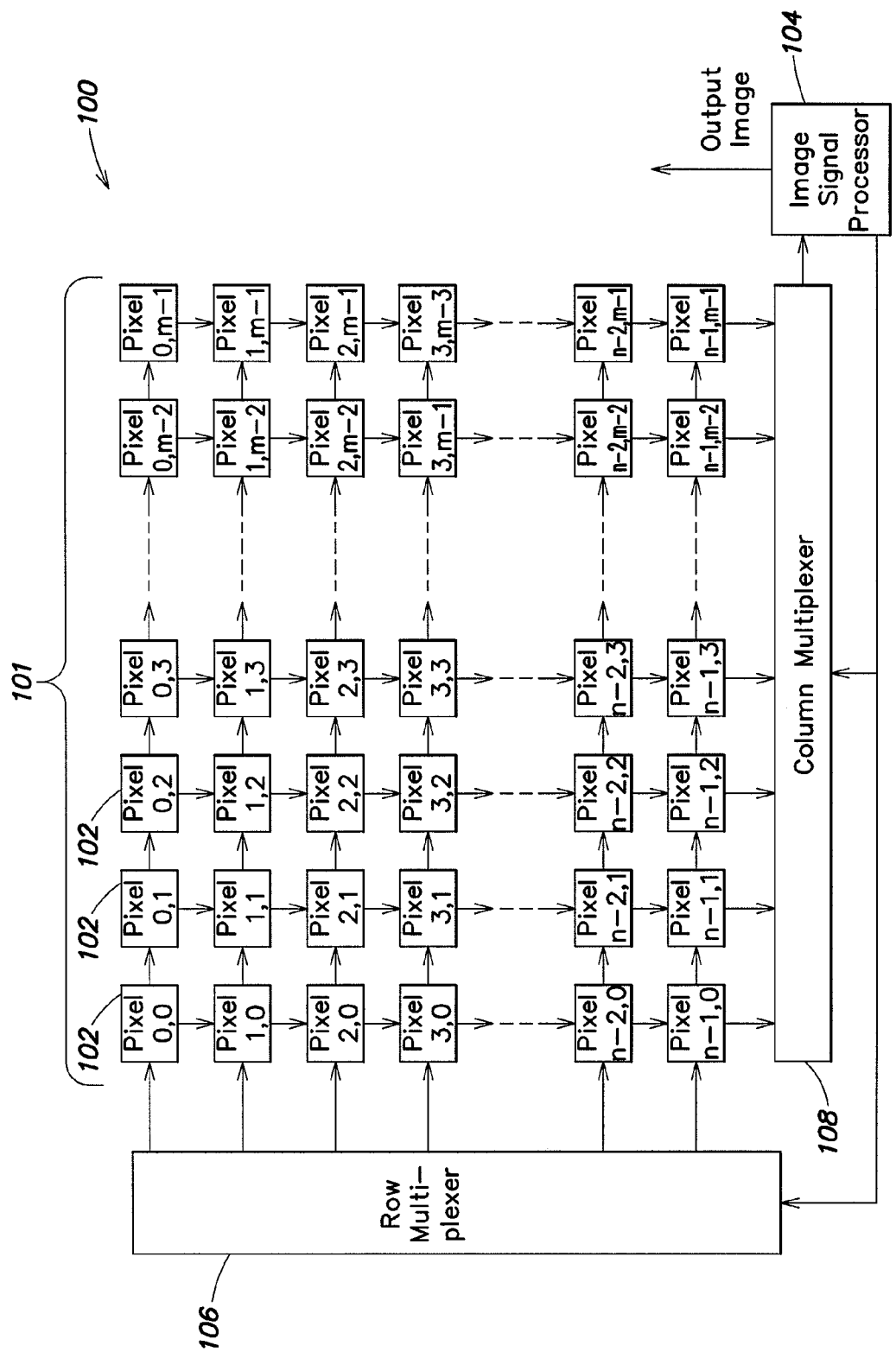
FIG. 1 illustrates a MOS imager in block diagram form according to the Prior Art.
Figure 2:
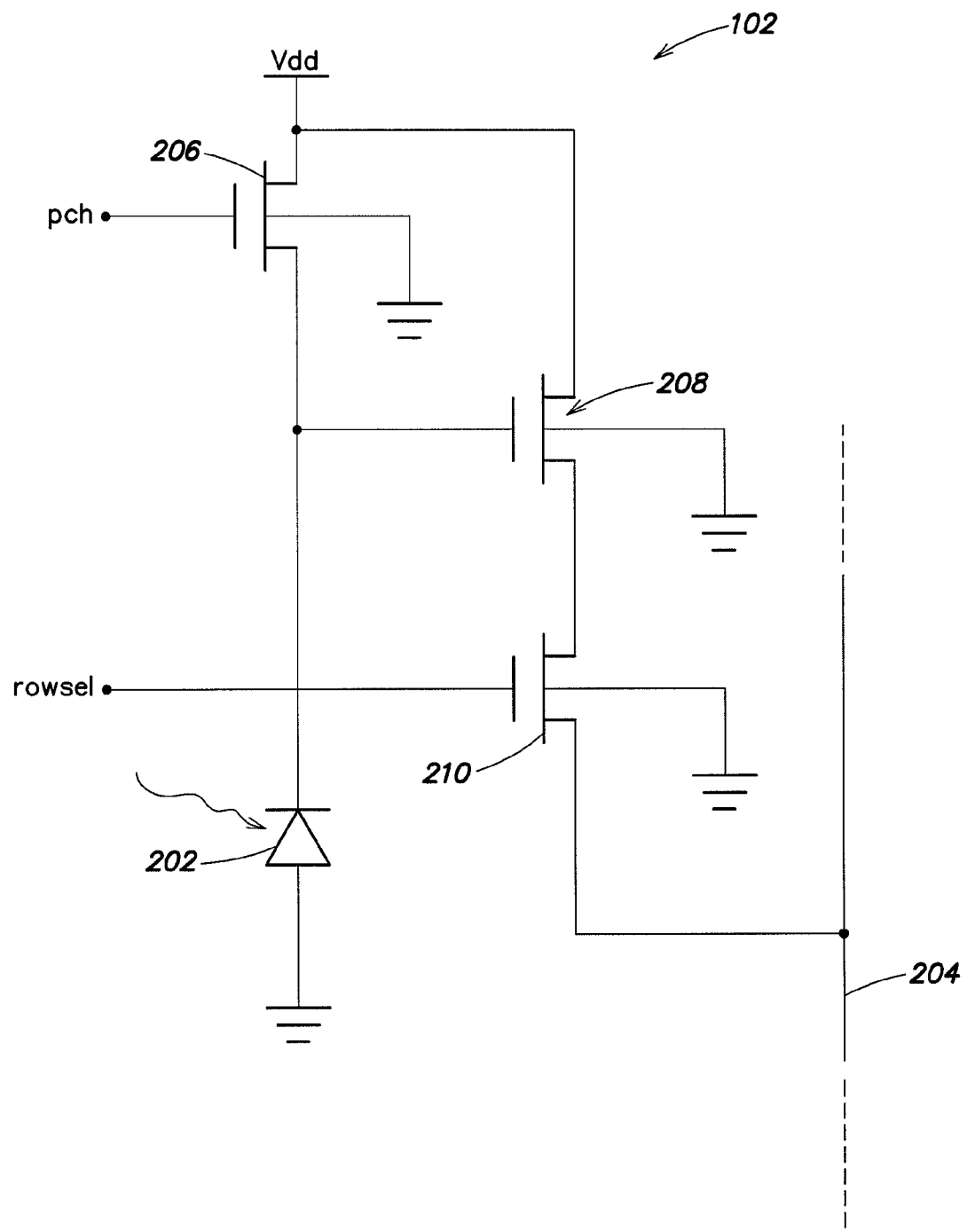
FIG. 2 is a circuit schematic of a MOS imaging pixel of the MOS imager of FIG. 1, according to the Prior Art.

Applicants have appreciated that the conventional pixel configuration of FIG. 2 has drawbacks. The source follower 208 typically has a gain of 0.7 or less due to changes in the threshold voltage as the voltage of the source varies with respect to the voltage of the body. As a result, the capacitance between the gate of the source follower 208 and the source of the source follower 208 creates an effective capacitance from the gate of the source follower 208 to ground. A capacitance to ground also exists between the gate of the source follower 208 and the body of the source follower 208. These capacitances can decrease the conversion gain of the pixel 102, given by the equation $\Delta V = \Delta Q/\Delta C$, where V is the voltage at the gate of the source follower 208, Q is the charge generated by the photodetector 202, and C is the effective capacitance to ground at the node connecting the output of photodetector 202 with the gate of source follower 208. Decreasing the size of the source follower 208 to minimize the corresponding capacitances leads to other drawbacks in operation of the pixel, such as increased flicker noise and increased threshold offset variation between pixels.

In addition, the gain of source follower 208 will change in response to changes in the source-to-body voltage of source follower 208. As a result of the change in the gain, the output of source follower 208 will change non-linearly in response to the optical signal at the gate of the source follower 208. Further, processing variations will cause the gain of source follower 208 to vary from one pixel to another. The non-uniformity from pixel-to-pixel of the non-linear gain creates a fixed pattern noise in an image formed by processing the outputs of the pixels.

According to one aspect of the invention, a unity gain buffer with bootstrapped input capacitance is included in a MOS imaging pixel. As used herein, reference to a unity gain buffer refers to a buffer with a gain of substantially one (i.e., a gain between approximately 0.9 and 1.05), and whose gain is substantially independent of the input signal to the buffer. The unity gain buffer may buffer a photovoltage generated by a photodetector of the pixel. By making the buffer a unity gain buffer with bootstrapped input capacitance, the input capacitance associated with the buffer may be minimized, thus providing a high conversion gain of the pixel and allowing the buffer to be made large without the operating drawbacks of conventional MOS imaging pixels.

According to one implementation, a MOS imaging pixel is provided having a unity gain buffer implemented as a bootstrapped source follower, meaning that a transistor of the source follower has its body electrically connected to its source. The source follower can be configured such that the source of the transistor provides a voltage which tracks a photovoltage generated by a photodetector of the pixel, i.e., when the photovoltage changes the voltage on the source and the body of the transistor may similarly change, such that the difference between these two voltages remains approximately constant when the transistor is turned on. The source follower may be a PMOS source follower or an NMOS source follower, as the type of source follower is non-limiting. The MOS imaging pixel can be part of a MOS imager, in which all or some of the other imaging pixels include a bootstrapped source follower. According to one embodiment, an imager is a device capable of detecting incident electromagnetic radiation and producing signals which can be used to form an image representing the presence and/or pattern of the radiation.

Figure 3:
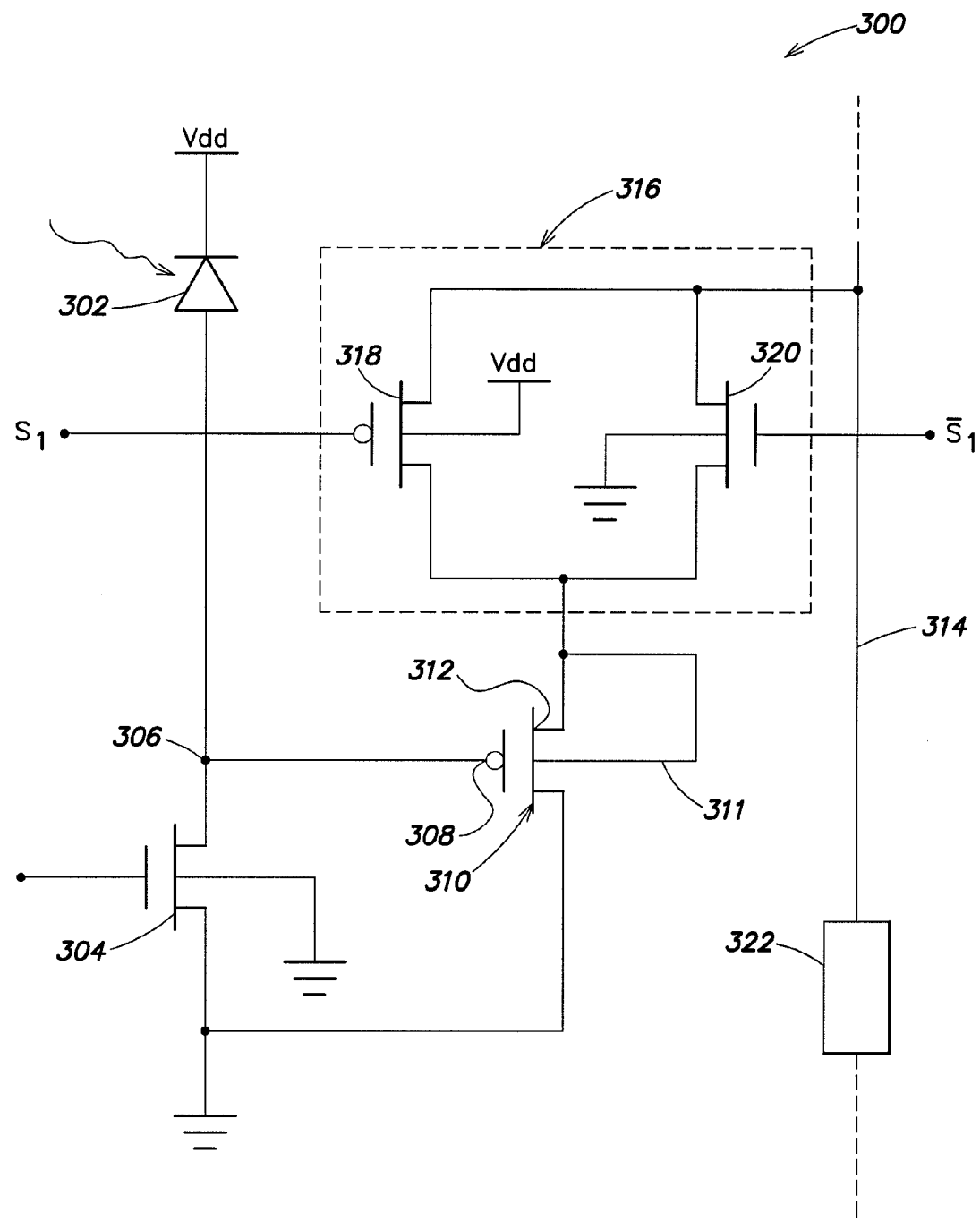
FIG. 3 is a circuit schematic MOS imaging pixel having a source follower with its body connected to its source, according to one embodiment.

According to one implementation, a MOS imaging pixel includes a PMOS bootstrapped source follower. FIG. 3 illustrates one non-limiting example of a circuit configuration of a pixel including such a bootstrapped source follower. The MOS imaging pixel 300 of FIG. 3 comprises a photodetector 302 which may detect radiation incident on the pixel 300 and generate a photocurrent in response to the incident radiation. In the embodiment shown in FIG. 3, the photodetector 302 is a photodiode, but any type of photodetector may be used (e.g., a phototransistor, etc.). Furthermore, the photodetector 302 may be capable of detecting any type of incident radiation, such as visible, near infrared, and/or short wavelength infrared radiation (e.g., radiation having wavelengths between approximately 1 and 1.6 microns), or any other wavelengths of radiation. The photodetector may be made of silicon, germanium, a silicon-germanium alloy, or any other suitable material. The photodetector may be monolithically integrated into the same substrate as the pixel circuitry or it may be part of an external photodiode array bonded to a substrate comprising the other circuitry of the pixels (e.g., silicon readout circuitry) as the aspect of the invention relating to an imaging pixel that employs a bootstrapped source follower is not limited to the materials used to form the photodetector, the wavelengths detected, or the configuration of the photodetector.

The photodetector 302 may be configured to be reverse-biased, having one terminal connected to a positive rail $V_{dd}$ and its other terminal connected to ground via a precharge transistor 304. As shown, precharge transistor 304 is an n-channel MOSFET, with its body grounded. However, the aspect of the invention relating to a MOS imaging pixel comprising a bootstrapped source follower is not limited in this respect, as the precharge transistor may take any suitable form. For example, the precharge transistor may be a p-channel MOSFET. The node at which the drain of precharge transistor 304 is connected to photodetector 302 represents an integration node 306, which also corresponds to a gate 308 of source follower 310, described further below.

The operation of pixel 300 can be considered with respect to discrete integration periods, i.e., discrete time intervals during which the amount of incident radiation falling on pixel 300 is to be determined. At the beginning of an integration period, precharge transistor 304 may be turned on. The precharge transistor may be used to initialize the value of the integration node 306, i.e., to reset the pixel at the beginning of an integration period. In FIG. 3, turning on the precharge transistor 304 brings the voltage of integration node 306 toward ground, so as to set the voltage of the integration node to an initial value. The precharge transistor 304 may then be turned off. Radiation incident on photodetector 302 may generate a photocurrent which is integrated at the integration node 306, thus generating an accumulated photocharge, and corresponding photovoltage, on the integration node 306 indicative of the amount of radiation incident on the pixel 300.

The voltage of the integration node 306, which again is indicative of the amount of radiation incident on pixel 300, may be provided to an output terminal of pixel 300 via source follower 310. The output terminal may be connected to column line 314. The source follower 310 is a bootstrapped source follower, having its body connected to its source. Accordingly, the voltage of the body 311 of source follower 310 is substantially equal to the voltage of the source 312 of source follower 310. Because the source 312 is configured, when connected to a suitable load, to track the voltage at gate 308 (i.e., the voltage at the source may change similarly to changes in the voltage at the gate, while the voltage of the source and gate may be different by an amount equal to the threshold voltage of the transistor), the voltage of the body 311 of source follower 310 may also track the voltage at the gate 308. Thus, the effective capacitance from the gate 308 to ground due to the capacitance between the gate 308 and the body 311, and between the gate 308 and the source 312, may be minimized or virtually eliminated.

As a result of connecting the source 312 to the body 311 the threshold voltage of the MOSFET does not change substantially with the voltage on the source 312. As a result, the gain of source follower 310 may be made approximately unity. For example, in one non-limiting example, the gain of source follower 310 may be between approximately 0.9 and approximately 1.05. Also, as a result of minimizing or virtually eliminating the effective capacitances between the gate 308 and ground, the sensitivity (also referred to as conversion gain and represented by $\Delta V = \Delta Q/\Delta C$, previously described) of the pixel 300 may be increased relative to conventional MOS imaging pixels since the capacitance associated with the integration node 306, which is partially dependent on the input capacitance of the source follower 310, may be minimized by minimizing the input capacitance of the source follower 310. Furthermore, the bootstrapped source follower 310 may be made physically large to minimize or eliminate performance degradation caused by phenomena such as flicker noise and pixel-to-pixel offset variation, without concern that increasing the size of the source follower will create a prohibitively large input capacitance that can negatively impact the operation of pixel 300, as in the prior art. This is because the bootstrapped configuration ensures that the input capacitance of the source follower remains small compared to the capacitance of the photodiode.

The voltage at source 312 of the source follower 310 may be provided, e.g., via a switch 316 or otherwise, to an output terminal of pixel 300 and then to a column line 314 as the output of pixel 300, indicative of the amount of radiation incident on pixel 300 during a given integration period. Thus, in the non-limiting example of pixel 300, the source 312 is coupled to the pixel output by a switch. However, the switch 316 may be omitted in some embodiments, such that the source of source follower 310 may function as the output terminal of the pixel 300, providing a voltage indicative of the amount of radiation incident on pixel 300. Other configurations are also possible.

In the non-limiting example of FIG. 3, the switch 316 is a complementary switch comprising a p-channel MOSFET 318 having its body connected to the positive rail $V_{dd}$ and an n-channel MOSFET 320 having its body grounded. The MOSFETs 318 and 320 may be controlled by selection signals $S_1$ and $\overline{S_1}$, where $S_1$ is the logical opposite of $\overline{S_1}$. The configuration of switch 316 may enable the voltage on source 312 of source follower 310 to cover approximately the entire range between ground and $V_{dd}$. However, it will be appreciated that other types of switches or techniques for providing the output of source follower 310 to the column line 314 may be used, as the aspects of the invention described herein are not limited to employing any particular type of switch.

As disclosed above, the voltage on integration node 306 may be read out to column line 314 by application of a suitable value of the selection signal $S_1$ to MOSFET 318 and its converse $\overline{S_1}$ to MOSFET 320, to turn those MOSFETS on. When MOSFETS 318 and 320 are on, source follower 310 may be connected to column line 314, which may comprise a load 322. The load 322 may be any suitable type of load, such as a resistor, a current source (e.g., a current mirror configured as a constant current source), or any other suitable type of load. It should be appreciated that although the transistor 310 is referred to above as a source follower, such a transistor only operates as a source follower when a suitable load is connected to the source terminal of the transistor. The connection of the source follower 310 to column line 314, and thus to load 322, may allow source follower 310 to operate as a source follower, such that the voltage at source 312 tracks the voltage at gate 308, which is the same as the voltage of the integration node 306.

It should be appreciated that the pixel 300 of FIG. 3 is one non-limiting implementation of a MOS imaging pixel having a bootstrapped source follower. Other implementations are also possible in accordance with other embodiments of the invention. For example, while source follower 310 is illustrated as a PMOS source follower, it should be appreciated that alternatively a pixel may be formed with an NMOS bootstrapped source follower with an n-channel MOSFET, with appropriate alterations made to the surrounding circuitry of the pixel. Such an NMOS configuration can be formed in numerous ways. For example, FIGS. 7A and 7B are exemplary alternative implementations of a MOS imaging pixel having an NMOS bootstrapped source follower.

Figure 7A:
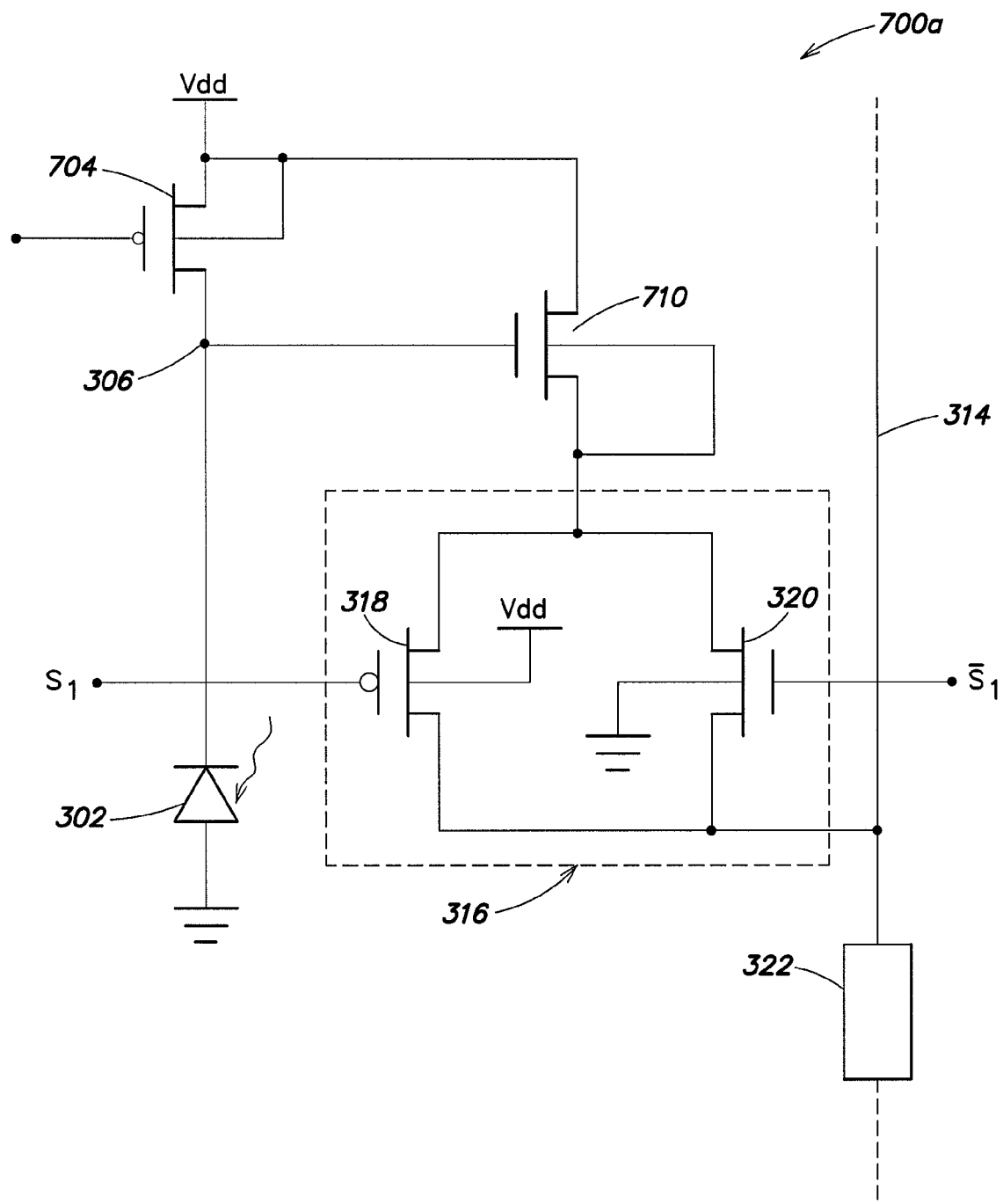
FIGS. 7A and 7B are circuit schematics of alternative embodiments of a MOS imaging pixel having an NMOS source follower with its body connected to its source.

The MOS imaging pixel 700a of FIG. 7A includes several of the same components already shown and described in relation to FIG. 3, which are not described in detail again here. However, pixel 700a comprises an n-channel source follower 710, as compared to the p-channel source follower 310 of FIG. 3. The source follower 710 is a bootstrapped source follower, having its body directly connected to its source, and operates substantially like source follower 310 of FIG. 3.

The MOS imaging pixel 700a also differs from pixel 300 of FIG. 3 in the arrangement and type of precharge circuitry. For example, in pixel 300 the photodetector 302 is connected to ground via an n-channel precharge transistor 304. In pixel 700a, the photodetector 302 has one terminal connected to ground, and a second terminal connected to the positive rail $V_{dd}$ via precharge transistor 704, which may be a p-channel MOSFET. The body of precharge transistor 704 is also directly connected to the positive rail $V_{dd}$, and therefore to the source of precharge transistor 704. Pixel 700a operates in substantially the same way as pixel 300, described above.

Figure 7B:
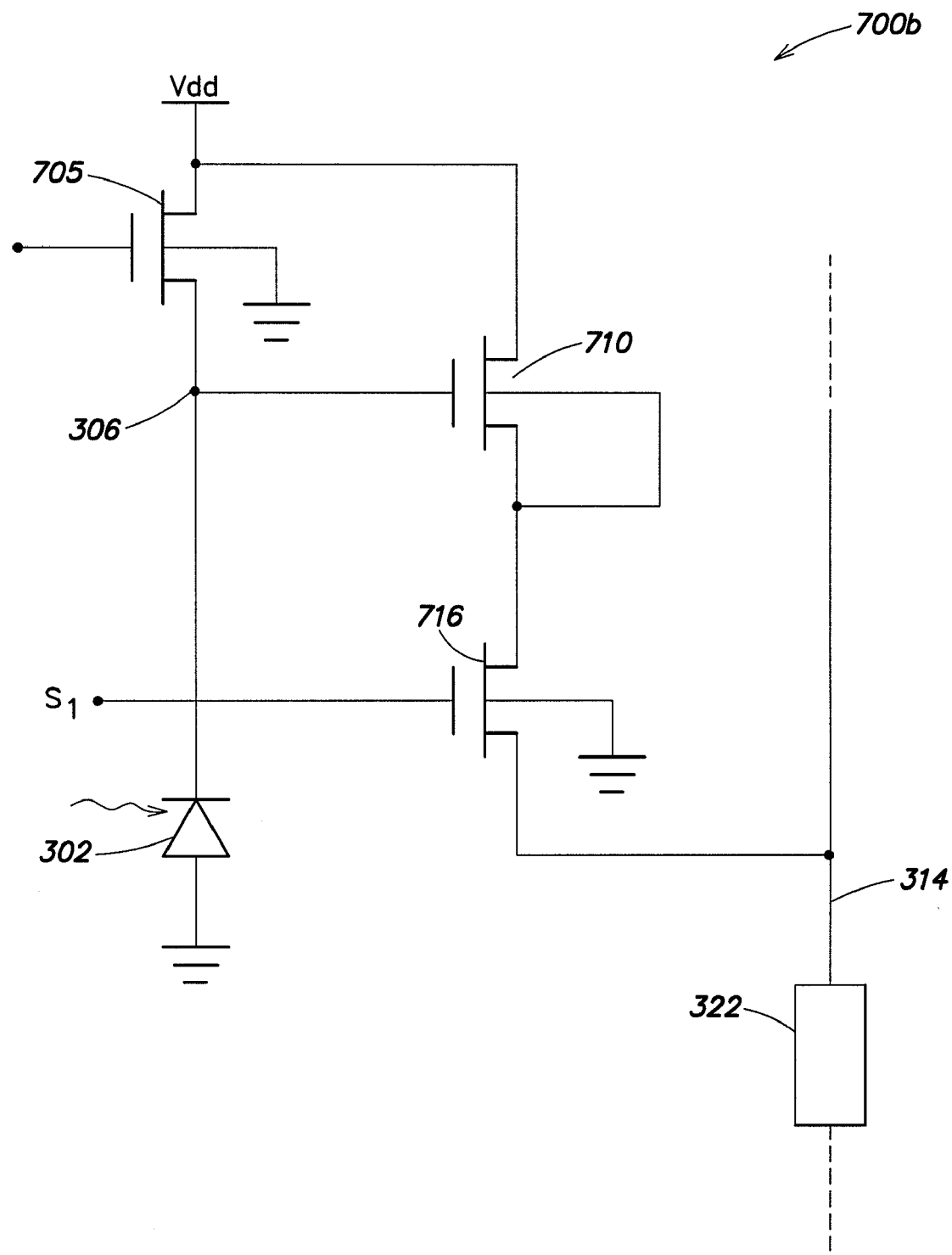

MOS imaging pixel 700b of FIG. 7B is a variation of pixel 700a, which also comprises an NMOS bootstrapped source follower. Pixel 700b differs from pixel 700a in that the complementary switch 316 of pixel 700a is replaced by a single transistor switch 716, which is controlled by the selection signal $S_1$, previously described. The switch 716 may be an n-channel MOSFET in the non-limiting example of FIG. 7B. Furthermore, the p-channel precharge transistor 704 of pixel 700a is replaced in pixel 700b with an n-channel precharge transistor 705, which may operate to set an initial voltage on the integration node 306, as previously described in connection with precharge transistor 304 of pixel 300. Pixel 700b operates in substantially the same way as pixels 300 and 700a.

As shown, FIGS. 3, 7A, and 7B illustrate three non-limiting implementations of a MOS imaging pixel comprising a bootstrapped source follower, according to one aspect of the invention. Other implementations are also possible, as these figures merely illustrate exemplary circuit schematics for such pixels. The aspects of the invention described herein are not limited to any particular implementation, either in terms of type (e.g., NMOS or PMOS) or configuration of components. For example, while precharge transistor 304 is illustrated as having its source terminal connected directly to ground, it should be appreciated that alternatives are possible. For example, the source terminal of precharge transistor 304 may be connected to a rail $V_{ss}$ having a value sufficiently above ground to ensure that the voltage of integration node 306 does not become negative at any point during the operation of the pixel 300, such as when the precharge transistor 304 is turned from on to off. For example, the source of precharge transistor 304 may be connected to a rail $V_{ss}$ of approximately 0.3 volts, 0.5 volts, or any other suitable value. Similarly, the precharge transistors 704 and 705 may not be connected directly to the positive rail $V_{dd}$, but rather may be connected in a manner to ensure that the voltage of the integration node 306 in pixels 700a and 700b does not go above $V_{dd}$, for example by directly connecting precharge transistors 704 and 705 to a voltage slightly below $V_{dd}$.

Furthermore, while load 322 is described as being part of the column line 314, it should be appreciated that other arrangements are possible. In this respect, load 322 may be located outside pixel 300 and may serve as a common load for the source followers of multiple pixels, as described below. When the pixel 300 (or pixels 700a and/or 700b) employs a load outside of the pixel itself (e.g., on a common column line shared by multiple pixels), it still is described herein as comprising a source follower. The aspect of the invention relating to a MOS imaging pixel comprising a bootstrapped source follower is not limited to any particular implementation of a load for the source follower, as any suitable load can be employed (including a dedicated load for each pixel).

Furthermore, the pixels described herein may be formed in any suitable manner, for example on a single substrate. The photodetector and pixel circuitry may be monolithically integrated on the substrate. Alternatively, the photodetectors of various pixels may be formed on a separate substrate from the circuitry of the pixels, with the substrate comprising the photodetectors and the substrate comprising the circuitry being bonded together, for example using bump bonding. Other implementations are also possible.

Figure 4A:
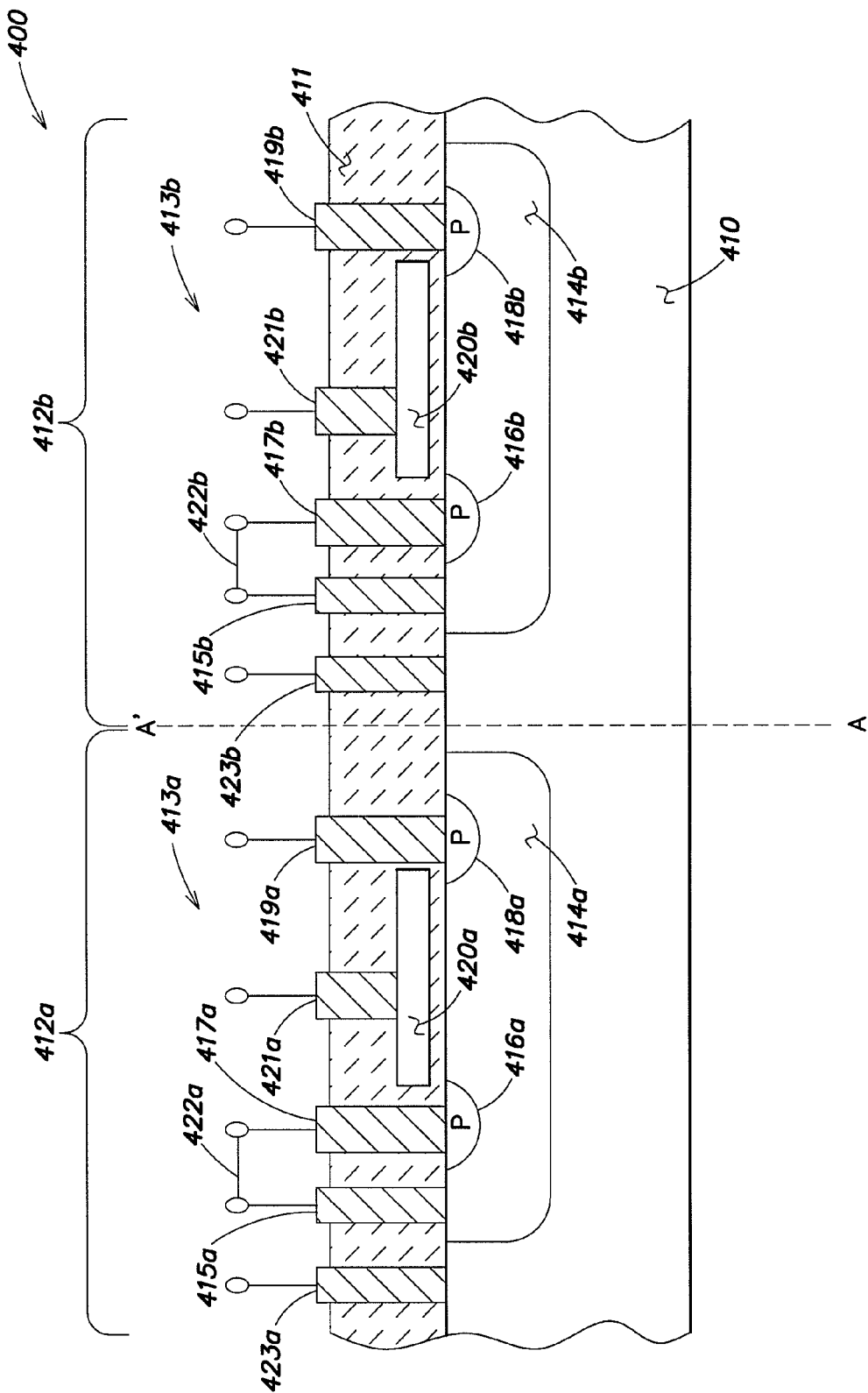
FIGS. 4A and 4B are alternative semiconductor implementations of the source follower of the MOS imaging pixel of FIG. 3.

As mentioned, in some embodiments the pixel 300 may be implemented using a PMOS source follower (i.e., using a p-channel MOSFET) as shown in FIG. 3, while in others it may be implemented using an NMOS source follower (such as in FIGS. 7A and 7B). The aspect of the invention relating to a MOS imaging pixel comprising a bootstrapped source follower is not limited in this respect. FIG. 4A illustrates one non-limiting implementation of multiple MOS imaging pixels that comprise PMOS bootstrapped source followers and are formed in a single substrate. For example, the semiconductor structure 400 comprises a substrate 410 in which multiple MOS imaging pixels, such as MOS imaging pixel 300 of FIG. 3, may be formed. It will be appreciated that the structure 400 illustrates only portions of two MOS imaging pixels 412a and 412b, and more specifically shows bootstrapped source followers of each of those two pixels. The dashed line A-A' illustrates a conceptual boundary between pixels 412a and 412b, but it will be appreciated that no physical boundary need be used in practice between the two pixels. Furthermore, FIG. 4A illustrates only a part of the substrate 410 (as shown by the broken edges), and the complete substrate may comprise more pixels than that shown. For example, the substrate 410 may include additional pixels in-plane with the pixels 412a and 412b to form a 2-D array.

Each pixel 412a and 412b in the non-limiting example of FIG. 4A comprises a PMOS bootstrapped source follower. The substrate 410 may be a p-type substrate, in which n-type wells 414a and 414b are formed. The n-type wells 414a and 414b correspond to the bodies of source followers 413a and 413b, respectively, and may isolate the source followers of neighboring pixels from each other. In this manner, the source of each source follower can be connected to its body, without short circuiting multiple pixels to each other. Conventional MOS imaging pixels do not use the wells 414a and 414b at least in part because the space required to form the wells requires the pixels to be made larger than conventional wisdom teaches is desirable, and because it also requires that more space per pixel be dedicated to the pixel circuitry (i.e., the source follower) than was conventionally thought desirable. Occupying more of the pixel space with circuitry, such as a source follower, decreases the amount of pixel space dedicated to the photodetector. But in some applications, the advantages obtained by the use of these wells to achieve a bootstrapped source follower, such as increased sensitivity, gain, and reduced noise, may outweigh the drawbacks of using increased silicon area to implement these wells.

The source follower 413a comprises p-type regions 416a and 418a in the n-type well 414a, which may form the source and drain of the source follower, respectively. Similarly, source follower 413b may comprise p-type regions 416b and 418b in the n-type well 414b, corresponding to the source and drain of that source follower, respectively. Contacts to the sources and drains may be formed through an insulating layer 411 disposed on the substrate 410. The insulating layer 411 may be an oxide layer or any suitable insulating layer. The source 416a may be accessed by a contact 417a, the drain 418a by a contact 419a, source 416b by a contact 417b, and drain 418b by contact 419b. The gates 420a and 420b of source followers 413a and 413b, respectively, may be accessed by contacts 421a and 421b disposed through the insulating layer 411. The contacts may be formed of any suitable materials, such as tungsten, or any other suitable material.

The source followers 413a and 413b are bootstrapped source followers, with each having its body directly connected to its source. As shown, a connection 422a connects contact 415a to contact 417a, thus connecting the body of source follower 413a to its source. Similarly, connection 422b connects contact 415b to contact 417b, thus connecting the body of source follower 413b to its source. The connections 422a and 422b may be formed in any suitable manner, such as using a metallization layer, as the aspect of the invention relating to a MOS imaging pixel having a bootstrapped source follower is not limited to any particular type of connection used to connect the body to the source.

The semiconductor structure 400 may further comprise substrate contacts 423a and 423b to provide access to the substrate 410. The substrate contacts may be formed in any suitable manner and using any suitable material.

Figure 4B:
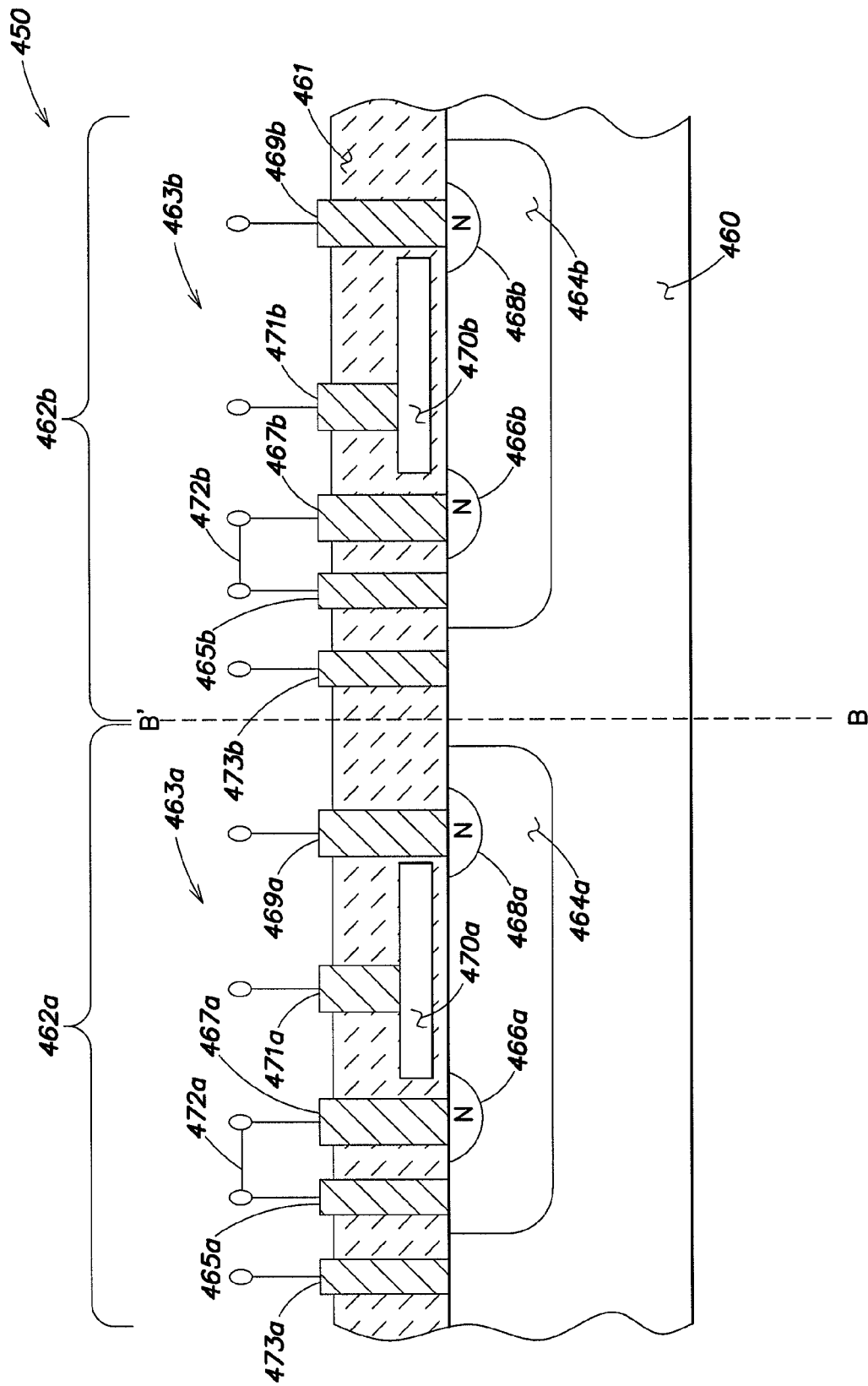

While a MOS imaging pixel having a bootstrapped source follower may be implemented using a PMOS source follower (e.g., pixel 300 of FIG. 3), an alternative implementation may use an NMOS bootstrapped source follower (e.g., pixels 700a and 700b of FIGS. 7A and 7B), such as that shown in FIG. 4B.

As shown, the semiconductor structure 450 in FIG. 4B is similar to semiconductor structure 400 of FIG. 4A, with differing conductivities for the substrate, bodies, sources, and drains.

The semiconductor structure 450 comprises a substrate 460 in which multiple MOS imaging pixels, such as MOS imaging pixel 700a of FIG. 7A or MOS imaging pixel 700b of FIG. 7B, may be formed. It will be appreciated that the structure 450 illustrates only portions of two MOS imaging pixels 462a and 462b, and more specifically shows bootstrapped source followers of each of those two pixels. The dashed line B-B' illustrates a conceptual boundary between pixels 462a and 462b, but it will be appreciated that no physical boundary need be used in practice between the two pixels. Furthermore, FIG. 4B illustrates only a part of the substrate 460 (as shown by the broken edges), and the complete substrate may comprise more pixels than that shown. For example, the substrate 460 may include additional pixels in-plane with the pixels 462a and 462b to form a 2-D array.

Each pixel 462a and 462b in the non-limiting example of FIG. 4B comprises an NMOS bootstrapped source follower. The substrate 460 may be an n-type substrate, in which p-type wells 464a and 464b are formed. The p-type wells 464a and 464b correspond to the bodies of source followers 463a and 463b, respectively, and may isolate the source followers of neighboring pixels from each other. In this manner, the source of each source follower can be connected to its body, without short circuiting multiple pixels to each other. As mentioned previously in connection with FIG. 4A, the inclusion of wells surrounding the source follower (i.e., wells 464a and 464b) is against conventional wisdom at least partially because of the space required to form such wells.

The source follower 463a comprises n-type regions 466a and 468a in the p-type well 464a, which may form the source and drain of the source follower, respectively. Similarly, source follower 463b may comprise n-type regions 466b and 468b in the p-type well 464b, corresponding to the source and drain of that source follower, respectively. Contacts to the sources and drains may be formed through an insulating layer 461 disposed on the substrate 460. The insulating layer 461 may be an oxide layer or any suitable insulating layer. The source 466a may be accessed by a contact 467a, the drain 468a by a contact 469a, source 466b by a contact 467b, and drain 468b by contact 469b. The gates 470a and 470b of source followers 463a and 463b, respectively, may be accessed by contacts 471a and 471b disposed through the insulating layer 461.

The source followers 463a and 463b are bootstrapped source followers, with each having its body directly connected to its source. As shown, a connection 472a connects contact 465a to contact 467a, thus connecting the body of source follower 463a to its source. Similarly, connection 472b connects contact 465b to contact 467b, thus connecting the body of source follower 463b to its source. The connections 472a and 472b may be formed in any suitable manner, such as using a metallization layer, as the aspect of the invention relating to a MOS imaging pixel having a bootstrapped source follower is not limited to any particular type of connection used to connect the body to the source.

The semiconductor structure 450 may further comprise substrate contacts 473a and 473b to provide access to the substrate 460. The substrate contacts may be formed in any suitable manner and using any suitable material.

While FIGS. 4A and 4B illustrate two examples of semiconductor structures to implement bootstrapped source followers, other implementations are possible. The aspect of the invention relating to a MOS imaging pixel comprising a bootstrapped source follower is not limited to any particular implementation of the bootstrapped source follower.

Figure 5:
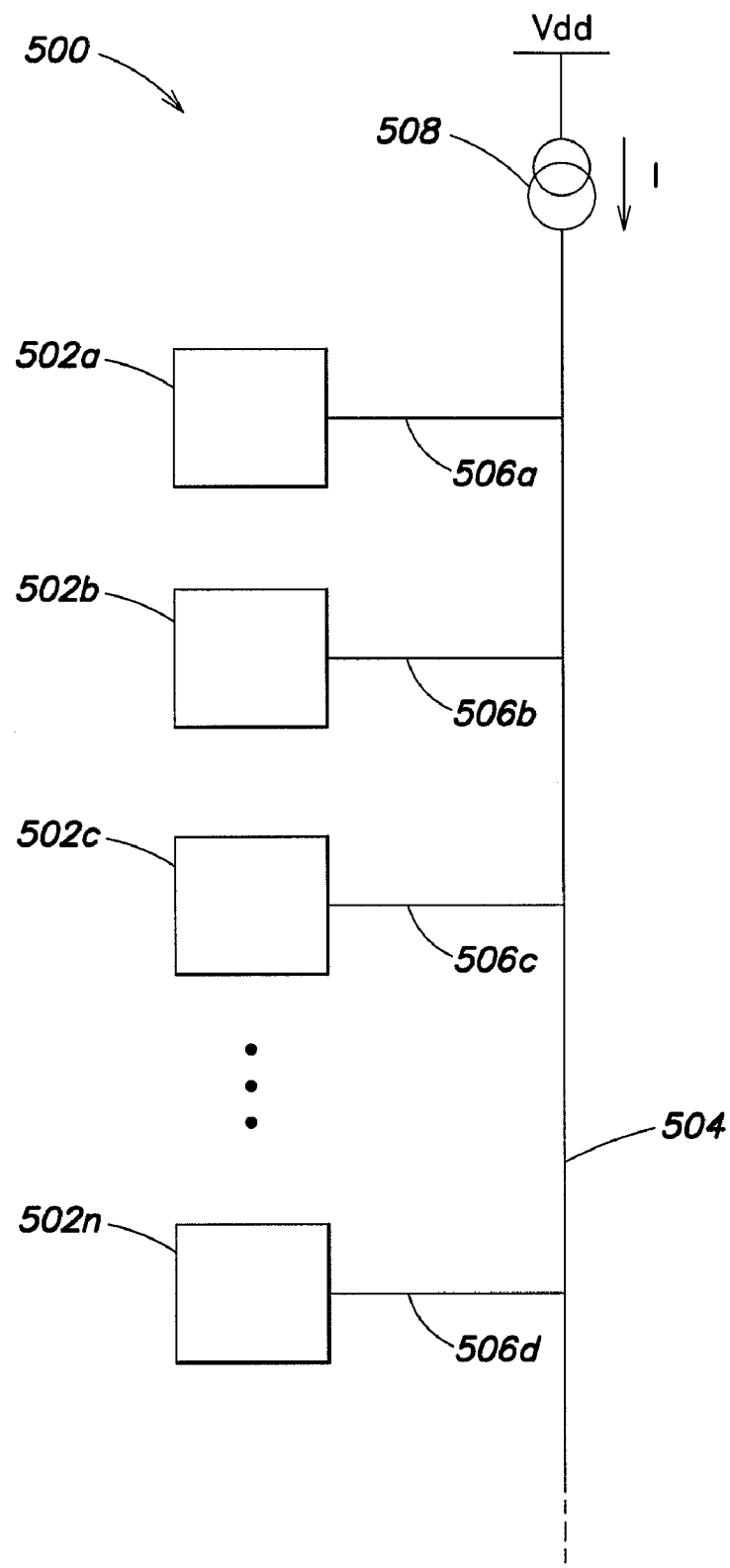
FIG. 5 is a block diagram of a column of imaging pixels of an imaging array connected to a common column line, according to one embodiment.

As mentioned, pixel 300 may be part of an imager comprising multiple pixels arranged in any suitable configuration, e.g., a focal plane array. When arranged in an array, pixels within each column of the focal plane array may share a column line, such as column line 314, to which they may provide their output signals to image processing circuitry, which may process the output signals to form an image. FIG. 5 illustrates one non-limiting example of a column of pixels connected to a common column line.

As shown, the column 500 comprises multiple pixels 502a, 502b, 502c . . . 502n, but can include any suitable number of two or more pixels. One or more of the pixels 502a . . . 502n can include a bootstrapped source follower (e.g., can take the form of pixel 300 from FIG. 3). Each of the pixels of the column 500 is connected to a common column line 504 by respective output lines 506a-506n. The output lines 506a-506n may be implemented in any suitable manner (e.g., may correspond to the output of switch 316 of FIG. 3).

As mentioned above, one or more of the pixels 502a-502n may comprises a source follower (e.g., may take the form of pixel 300 of FIG. 3). As discussed above, while in some embodiments each of the pixels 502a-502n may have its own load 322, in others column line 504 may comprise a load 508 (illustrated in this non-limiting example as a constant current source, although a resistor, or any other suitable load, may be used) that may be shared among the pixels 502a-502n coupled to the column line. When the output signal of a pixel 502 is to be read out, that pixel may be connected to column line 504, for example by opening a switch (e.g., such as switch 316 in FIG. 3). The circuitry of that pixel may then be connected to the load 508 on column line 504, such that the source follower transistor located within the pixel may operate as a source follower with its source terminal tracking a voltage representative of a photovoltage generated at least partially by a photodetector of the pixel, such as the configuration of source follower 310 of FIG. 300.

According to one implementation, the pixels 502a-502n may be sequentially connected to column line 504, such that only one pixel 502 may be connected to the column line 504, and therefore to load 508, at any given time. As discussed above, in one illustrative embodiment, the column 500 may be part of a larger focal plane array comprising multiple columns of pixels. The output signals of the pixels of the focal plane array may be read out by row. For example, the selection signals $S_1$ and $\overline{S_1}$ of FIG. 3 may correspond to row select signals, applied to all the pixels of a row of the focal plane array to read out the output signals of the pixels of that row to their respective column lines. In this manner, each of the pixels 502a-502n of a column may share a common load 508 on the column line 504.

It should be appreciated that FIG. 5 illustrates a single column of pixels which may be part of a focal plane array. Each column of the focal plane array may be connected to its own column line 504. Other implementations are also possible, as the aspect of the invention relating to a MOS imager comprising a focal plane array of pixels, one or more of which comprises a bootstrapped source follower, is not limited to any particular arrangement of pixels within the focal plane array.

It should be appreciated that arrays implementing pixels of the type described herein may exhibit greater linearity and smaller pixel-to-pixel gain variation than conventional pixel arrays. In conventional pixel arrays, in which the gain of source followers was typically 0.7 or less, the gain non-linearity and the variation in gain between the pixels could be relatively large, causing image artifacts such as fixed pattern noise. By using pixels having unity gain source followers, the non-linearity and the variation in gain between pixels may be significantly smaller than in arrays of conventional pixels, providing improved imager operation.

Figure 6:
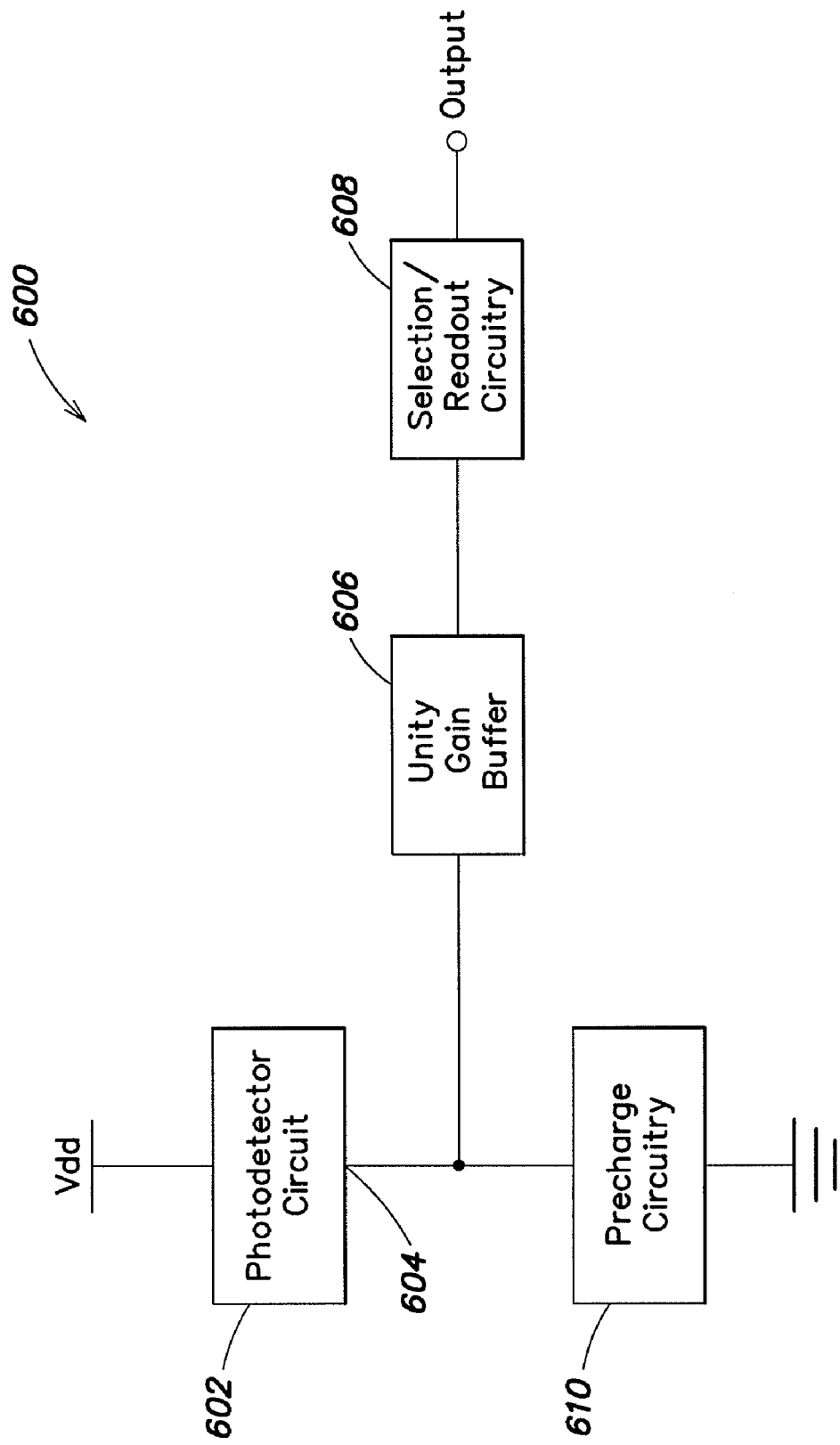
FIG. 6 is a block diagram of a pixel including a source follower with its body connected to its source, according to one embodiment.

FIGS. 3, 7A, and 7B illustrate non-limiting circuit schematics of MOS imaging pixels comprising a bootstrapped source follower. However, other implementations are possible. In this respect, a generalized circuit schematic is illustrated in FIG. 6, which is a block diagram of a MOS imaging pixel according to one embodiment.

The MOS imaging pixel 600 comprises a photodetector circuit 602 coupled to a positive rail $V_{dd}$, and which may comprise a photodetector to detect incident radiation and produce a signal in response thereto, indicative of the amount of incident radiation. The photodetector can be implemented in any suitable way. The photodetector circuit 602 may further comprise any suitable integration circuitry to integrate a signal from the photodetector and produce an output voltage at the output 604 indicative of the amount of incident radiation. Examples of suitable integration circuitry include those described above, but others are also possible. A unity gain buffer having a bootstrapped input capacitance 606 may be included to condition the output signal from photodetector circuit 602 to provide the output signal of the pixel 600.

The unity gain buffer 606 may be any suitable unity gain buffer having a bootstrapped input capacitance, such as a bootstrapped source follower of the type described in any of the examples above. For example, the unity gain buffer may comprise a bootstrapped source follower having a p-channel MOSFET. The output of the unity gain buffer may be provided as the output of the pixel 600 by selection/readout circuitry 608, which may operate to readout the signal from unity gain buffer 606 at a suitable time. The pixel 600 may further comprise precharge circuitry 610, which may condition or initialize the signal provided as an input to unity gain buffer 606. However, the pixel 600 is not limited in this respect, as the precharge circuitry 610 may be omitted in some implementations.

It should be appreciated that pixel 600 may be implemented in any suitable form. For example, pixel 600 may be implemented on a single substrate, or in any other suitable manner. The circuitry illustrated in FIG. 6 may be monolithically integrated together, such as on a single substrate, or may comprise a photodiode that is part of a monolithic photodiode array bonded to circuitry that is part of a monolithic pixel readout array, as in a hybrid imaging array, or may be formed by discrete circuit components. The pixels may be formed by discrete components.

Furthermore, the pixels, and imagers described herein, may be take any suitable size. For example, according to one illustrative implementation, the pixels described herein (e.g., the pixels of FIGS. 3, 7A, and/or 7B) may have surface areas of less than approximately 300 square microns, less than approximately 150 square microns, or take any other suitable values. The various aspects of the invention are not limited in this respect.

Having described several embodiments of the various aspects of the invention in detail, various modifications and improvements will readily occur to those skilled in the art. Such modifications and improvements are intended to be within the spirit and scope of the aspects of the invention. Accordingly, the foregoing description is by way of example only, and is not intended as limiting. The invention is limited only as defined by the following claims and the equivalents thereto.

The invention claimed is:

1. An apparatus comprising:
a first MOS imaging pixel comprising:
a photodetector configured to receive incident radiation and produce a photocurrent in response to the incident radiation;
a MOS field effect transistor (MOSFET) configured as a source follower, the MOSFET having a body, a source, and a gate, the source being directly connected to the body such that they remain at substantially the same electrical potential, and the gate being coupled to the photodetector to receive a voltage signal resulting at least partially from integration of the photocurrent and indicative of an amount of the incident radiation;
a precharge transistor coupled to the photodetector and configured to inject a precharge on the gate of the MOSFET; and
a switch comprising a p-channel transistor and an n-channel transistor, the switch coupled between the source of the MOSFET and a column line and configured to provide a voltage on the source of the MOSFET to the column line,
wherein the column line interconnects a plurality of MOS imaging pixels including the first MOS imaging pixel.

2. The apparatus of claim 1, wherein the photodetector is configured to detect radiation in the short wavelength infrared spectrum.

3. The apparatus of claim 1, wherein the first MOS imaging pixel further comprises a substrate of a first conductivity type (n or p), and wherein the body of the MOSFET comprises a well of a second conductivity type (n or p) formed in the substrate, the second conductivity type being opposite the first conductivity type.

4. The apparatus of claim 3, wherein the MOSFET is a p-channel MOSFET and the well is an n-type well.

5. The apparatus of claim 3, wherein the MOSFET is an n-channel MOSFET and the well is a p-type well.

6. The apparatus of claim 1, wherein the apparatus further comprises a substrate and the plurality of MOS imaging pixels including the first MOS imaging pixel, and wherein the plurality of MOS imaging pixels are formed on the substrate and configured in a focal plane array.

7. The apparatus of claim 1,
wherein the source follower operates as a buffer having a gain that is at least approximately 0.9.

8. The apparatus of claim 1, wherein the first MOS imaging pixel has a surface area less than approximately 150 square microns.

9. The apparatus of claim 2, wherein the photodetector is configured to detect short wavelength infrared (SWIR) radiation having a wavelength in the range from approximately 1.1 microns to approximately 1.6 microns.

10. The apparatus of claim 9, wherein the photodetector comprises germanium.

11. The apparatus of claim 7, wherein the gain of the buffer is less than approximately 1.05.

12. The apparatus of claim 11, wherein the gain of the buffer is at least approximately 0.95.

* * * * *